(12) United States Patent
Chen et al.

(10) Patent No.: US 11,693,724 B2
(45) Date of Patent: Jul. 4, 2023

(54) BIT ERROR RATE ESTIMATION AND ERROR CORRECTION AND RELATED SYSTEMS, METHODS, DEVICES

(71) Applicant: Microchip Technology Incorporated, Chandler, AZ (US)

(72) Inventors: Dixon Chen, Guangdong (CN); Jiachi Yu, Guangdong (CN); Kevin Yang, Guangdong (CN)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/654,739

(22) Filed: Oct. 16, 2019

(65) Prior Publication Data
US 2021/0055980 A1  Feb. 25, 2021

(30) Foreign Application Priority Data
Aug. 23, 2019 (CN) .......................... 201910784043.6

(51) Int. Cl.
*G06F 11/07* (2006.01)
*G06F 11/32* (2006.01)
(Continued)

(52) U.S. Cl.
CPC ........ *G06F 11/076* (2013.01); *G06F 11/0793* (2013.01); *G06F 11/1608* (2013.01); *G06F 11/322* (2013.01); *H03M 5/12* (2013.01); *H04L 1/20* (2013.01); *H04L 1/205* (2013.01); *H04L 25/4904* (2013.01)

(58) Field of Classification Search
CPC ....... H04L 1/20; H04L 1/205; H04L 25/4904; H03M 5/12; G06F 11/076; G06F 11/0793; G06F 11/1608; G06F 11/322
See application file for complete search history.

(56) References Cited

U.S. PATENT DOCUMENTS

| 5,862,157 A | 1/1999 | Bessios |
| 9,112,722 B2 | 8/2015 | Lusted et al. |

(Continued)

OTHER PUBLICATIONS

"IEEE standard methods and equipment for measuring the transmission characteristics of pulse-code modulation (PCM) telecommunications circuits and systems", IEEE Standard; IEEE Piscataway, NJ, USA (Jan. 1992) 146 pages.
(Continued)

*Primary Examiner* — April Y Blair
*Assistant Examiner* — Sazzad Hossain
(74) *Attorney, Agent, or Firm* — TraskBritt

(57) ABSTRACT

Physical layer devices and related methods for determining Bit Error Rates (BERs) and correcting errors in signals received through shared transmission media of wireless local area networks are disclosed. A physical layer device is configured to identify coding violations in received signal, determine a rate of the coding violations in the signal, and estimate a BER of the signal to be equal to the determined rate of the coding violations. A physical layer device is configured to invert a half symbol immediately preceding or immediately following a coding violation based, at least in part, on signal integrities of the half symbol immediately preceding and the half symbol immediately following the coding violation to correct a bit error.

18 Claims, 11 Drawing Sheets

(51) Int. Cl.
*G06F 11/16* (2006.01)
*H04L 1/20* (2006.01)
*H04L 25/49* (2006.01)
*H03M 5/12* (2006.01)

(56) References Cited

U.S. PATENT DOCUMENTS

| | | | |
|---|---|---|---|
| 10,085,213 B1* | 9/2018 | Nimmala | H04W 52/0261 |
| 2004/0247051 A1* | 12/2004 | Vasana | H04L 25/4904 375/333 |
| 2007/0223390 A1* | 9/2007 | Kobayashi | H04L 1/0009 370/252 |
| 2008/0008253 A1* | 1/2008 | Sugiura | H04L 25/4904 375/243 |
| 2012/0314710 A1* | 12/2012 | Shikano | H04L 47/122 370/392 |
| 2015/0326342 A1 | 11/2015 | Thaler et al. | |

OTHER PUBLICATIONS

Invitation to Pay Additional Fees from International Application No. PCT/US2020/070365, dated Nov. 24, 2020, 14 pages.
International Search Report from International Application No. PCT/US2020/070365, dated Feb. 3, 2021, 7 pages.
International Written Opinion from International Application No. PCT/US2020/070365, dated Feb. 3, 2021, 12 pages.

* cited by examiner

BIT ERROR RATE ESTIMATION AND ERROR CORRECTION AND RELATED SYSTEMS, METHODS, DEVICES

PRIORITY CLAIM

This application claims the benefit of the filing date of Chinese Provisional Patent Application Serial No. 201910784043.6, filed Aug. 23, 2019, for "BIT ERROR RATE ESTIMATION AND ERROR CORRECTION AND RELATED SYSTEMS, METHODS, DEVICES."

TECHNICAL FIELD

The present disclosure relates, generally, to Bit Error Rate (BER) detection and error correction of signals, and more specifically to BER detection and error correction of signals received through shared transmission media of wired local area networks.

BACKGROUND

The IEEE 802.3cg is defining 10BASE-T1S (aka cg) for use with automotive sensors, audio, other devices, and combinations thereof. Other target market segments for cg include backplanes and Internet of Things (IoT) networks. The cg specification targets a ten megabits per second (10 Mbps) multi-drop bus that uses Carrier Sense Multiple Access (CSMA) with Physical Layer Collision Avoidance (PLCA).

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
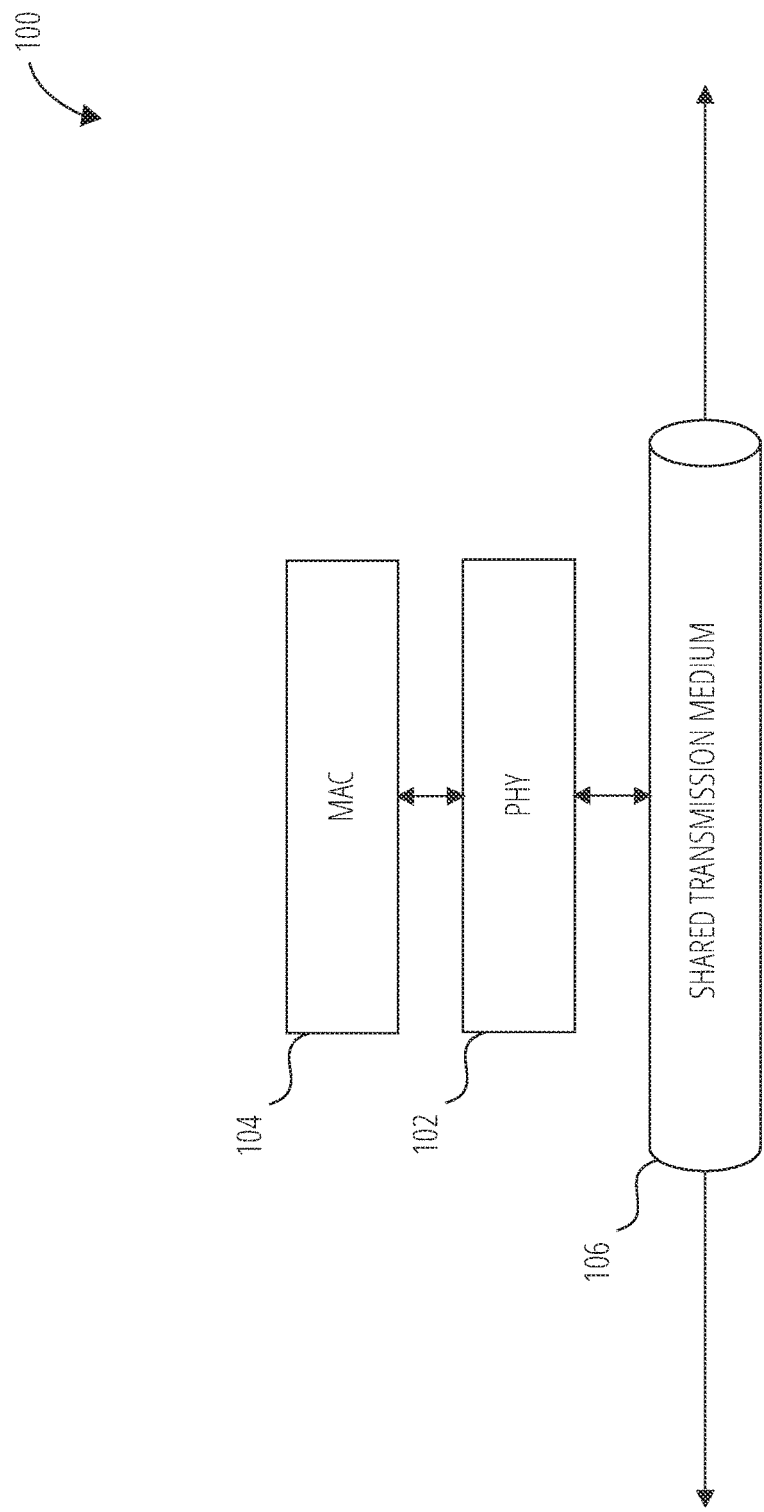
FIG. 1 is a functional block diagram of a network segment, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

A vehicle, such as an automobile, a truck, a bus, a ship, and/or an aircraft, may include a vehicle communication network. The complexity of a vehicle communication network may vary depending on a number of electronic devices within the network. For example, an advanced vehicle communication network may include various control modules for, for example, engine control, transmission control, safety control (e.g., antilock braking), and emissions control. To support these modules, the automotive industry relies on various communication protocols.

10BASE T1S physical layer circuitry for wired local area networks such as Ethernet may sometimes use two-level Differential Manchester Encoding (DME). The DME coding rule specifies that there should always be a signal transition at a transition between clock periods (sometimes referred to herein as "clock transition"). If a signal transition is missed at a clock transition, breaking the DME coding rule (DME coding violation), an average of about one bit error per DME coding violation may be caused on decoded data. As a result, a number of DME coding violations should be close to the same as a number of decoded data errors (e.g., bit errors). Embodiments disclosed herein, therefore, use DME coding violation rate to correlate to a bit error rate (BER) of decoded data. Such BER may be used, for example, in signal Quality Indicator (SQI) reporting.

Disclosed herein are devices of a physical layer for connecting to a wired local area network that may be used in 10BASE-T1 endpoints and switches to monitor a Signal Quality Index (SQI) of signals received over a communication bus. Embodiments disclosed herein may rely on a number of DME coding violations being relatively close to a number of decoded data errors. As a result, a DME coding violation ratio may be used to estimate a BER of decoded data. For example, a number of DME violations may be counted over a specific time period to calculate a DME violation rate, which may be used to estimate a decoded BER. This BER may be reported for functional safety purposes.

Quadrature clocks may be used to better identify missing transitions. Oversampling with quadrature clocks may be used to identify signal transitions that are missing at clock edges due to random jitter. Based on an oversampled dataset, such bit errors can be corrected, resulting in lower BER.

Since disclosed embodiments determine BER based on DME violations in contrast to more complex Digital Signal Processing (DSP) techniques used in point-to-point links, less power and chip real estate may be used to practice embodiments disclosed herein as compared to systems previously known by the inventors of this disclosure.

In some embodiments, disclosed herein are improved methods for effectively estimating the BER utilizing DME. Bit error correction may be applied based on DME violation correction. Symbols (e.g., half symbols) before and after a missed clock transition may be compared to determine which of the symbols is most likely to be responsible for the DME violation (e.g., inverted by noise). The symbol (e.g., half symbol) that is determined to most likely be responsible for the DME violation may be inverted to attempt to correct the DME violation, which may correspondingly correct a bit error, on average. Such bit error correction may improve BER performance. Network reliability, especially in a noise and/or interference rich environment (e.g., the automotive environment), may also be improved using error correction techniques discussed herein. The BER may be estimated and the error correction may be performed without engaging complicated analog support circuitry for DSP algorithms. Although embodiments disclosed herein specifically discuss BER estimation and error correction in the context of wired local area networks (e.g., Ethernet), these embodiments find relevance and may be used in any application where DME is used.

FIG. 1 is a functional block diagram of a network segment 100 including a link layer device, MAC 104, and a physical layer (PHY) device, PHY 102, according to some embodiments. As non-limiting examples, network segment 100 may be a segment of a multi-drop network, a segment of a multi-drop sub-network, a segment of a mixed media network, or a combination thereof or sub combination thereof. As non-limiting examples, network segment 100 may be, be part of, or include one or more of a microcontroller-type embedded system, a user-type computer, a computer server, a notebook computer, a tablet, a handheld device, a mobile device, a wireless earbud device or headphone device, a wired earbud or headphone device, or a system or subsystem for an appliance, lighting, sound, building control, residential monitoring (e.g., for security or utility usage, without limitation), elevator, public transit control (e.g., for above ground train, below ground train, trolley, or bus, without limitation), automobile, or industrial control, without limitation.

PHY 102 may be configured to interface with MAC 104. As non-limiting examples, PHY 102 and/or MAC 104 may be chip packages including memory and/or logic configured for carrying out all or portions of embodiments described herein. As non-limiting examples, PHY 102 and MAC 104, respectively, may be implemented as separate chip packages or circuitry (e.g., integrated circuits) in a single chip package (e.g., a system-in-a-package (SIP)).

PHY 102 also interfaces with shared transmission medium 106, a physical medium that is a communication path for nodes that are part of network segment 100 or a network of which network segment 100 is a part, including nodes that include a respective instance of PHY 102 and MAC 104. As a non-limiting example, shared transmission medium 106 may be a single twisted pair such as used for single pair Ethernet.

Signals received through the shared transmission medium 106 may be laden with noise, especially in environments that are especially prone to noise (e.g., automotive or building environments). In some instances it may be useful to report SQI to enable monitoring of the signal quality of received signals. In some embodiments, the PHY 102 may be configured to determine and report the SQI.

Figure 2:
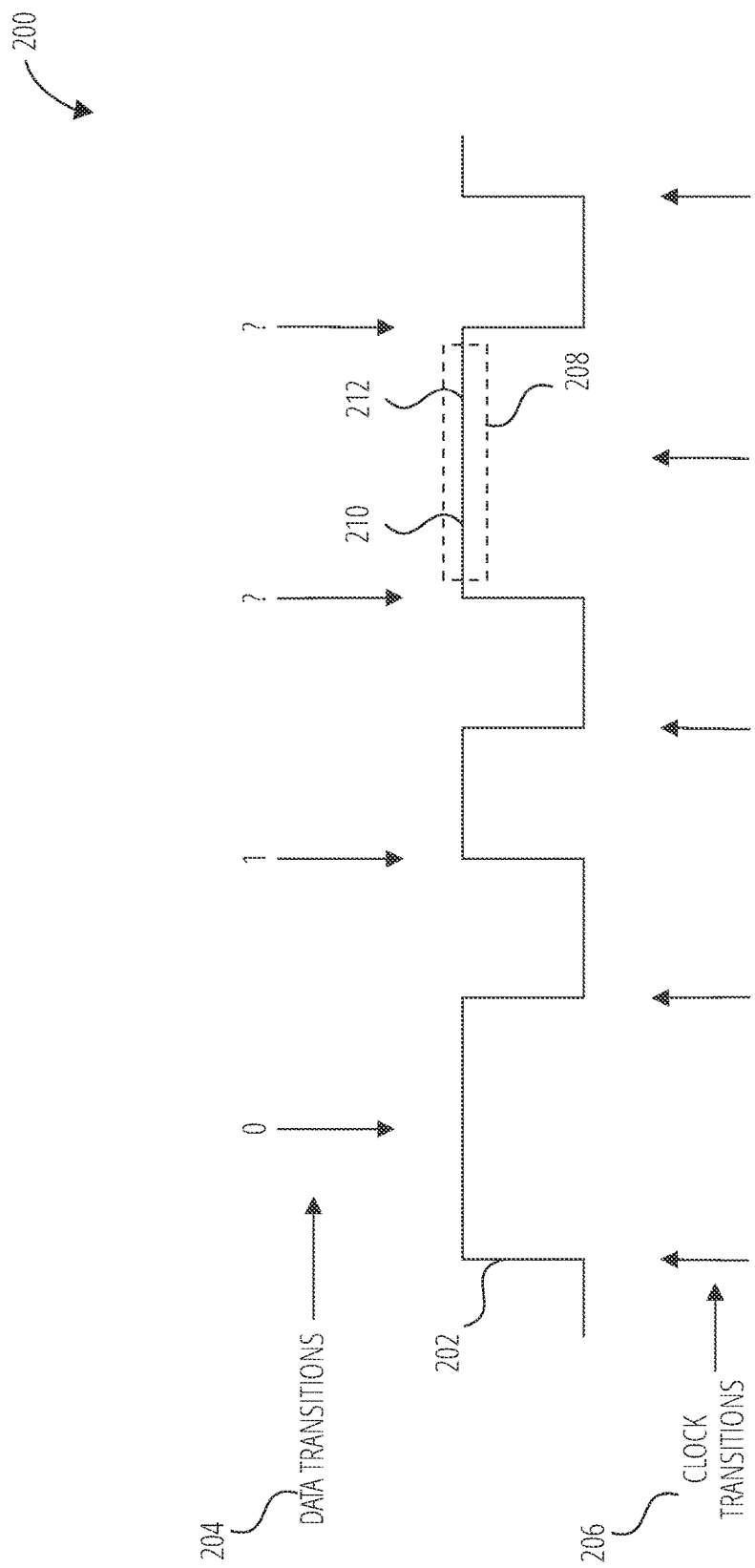
FIG. 2 is a signal timing diagram illustrating a Differential Manchester Encoding (DME) violation.

FIG. 2 is a signal timing diagram 200 illustrating a DME violation 208. The signal timing diagram 200 includes a signal 202 that transitions between a logic level high voltage level and a logic level low voltage level at different points in time. In the signal timing diagram 200, time passage from earlier to later corresponds to the left to right direction along the signal 202.

The signal timing diagram 200 also includes data transitions 204 and clock transitions 206, each of which are spaced at regular intervals in time. The data transitions 204 occur about halfway between the clock transitions 206. According to DME, the signal 202 should transition from one logic voltage level to another at the clock transitions 206. Also according to DME, the signal 202 is configured to remain constant at the data transitions 204 to signal a "0" and to transition from one logic voltage level to another at the data transitions 204 to signal a "1." Accordingly, a "symbol" under DME refers to a period of the signal 202 between clock transitions 206. Also, a "half symbol" refers to a period of the signal 202 between a clock transition 206 and a data transition 204. A "symbol" includes two "half symbols," which together signal either a "0" or a "1." Further, correcting a "half symbol" (e.g., by inverting the "half symbol") also corrects the "symbol" to which the "half symbol" belongs. It should be noted that remaining constant at the data transitions 204 could equally be used to signal a "1" and a transition from one logic voltage level to another at the data transitions 204 could be used to signal a "0."

The signal 202 includes a DME violation 208 where the signal 202 does not transition from one logic voltage level to another at a clock transition. In the signal 202, a half symbol 210 immediately preceding the clock transition of the DME violation 208 and a half symbol 212 immediately following the clock transition of the DME violation 208 are both at the logic level high voltage level. As a result, it may be determined that a bit error occurred. More specifically, it may be assumed that one of half symbol 210 or half symbol 212 has been inverted. As a result, the correct values of the bit prior to the DME violation 208 and the bit after the DME violation 208 are unknown (marked with "?" in FIG. 2).

Figure 3:
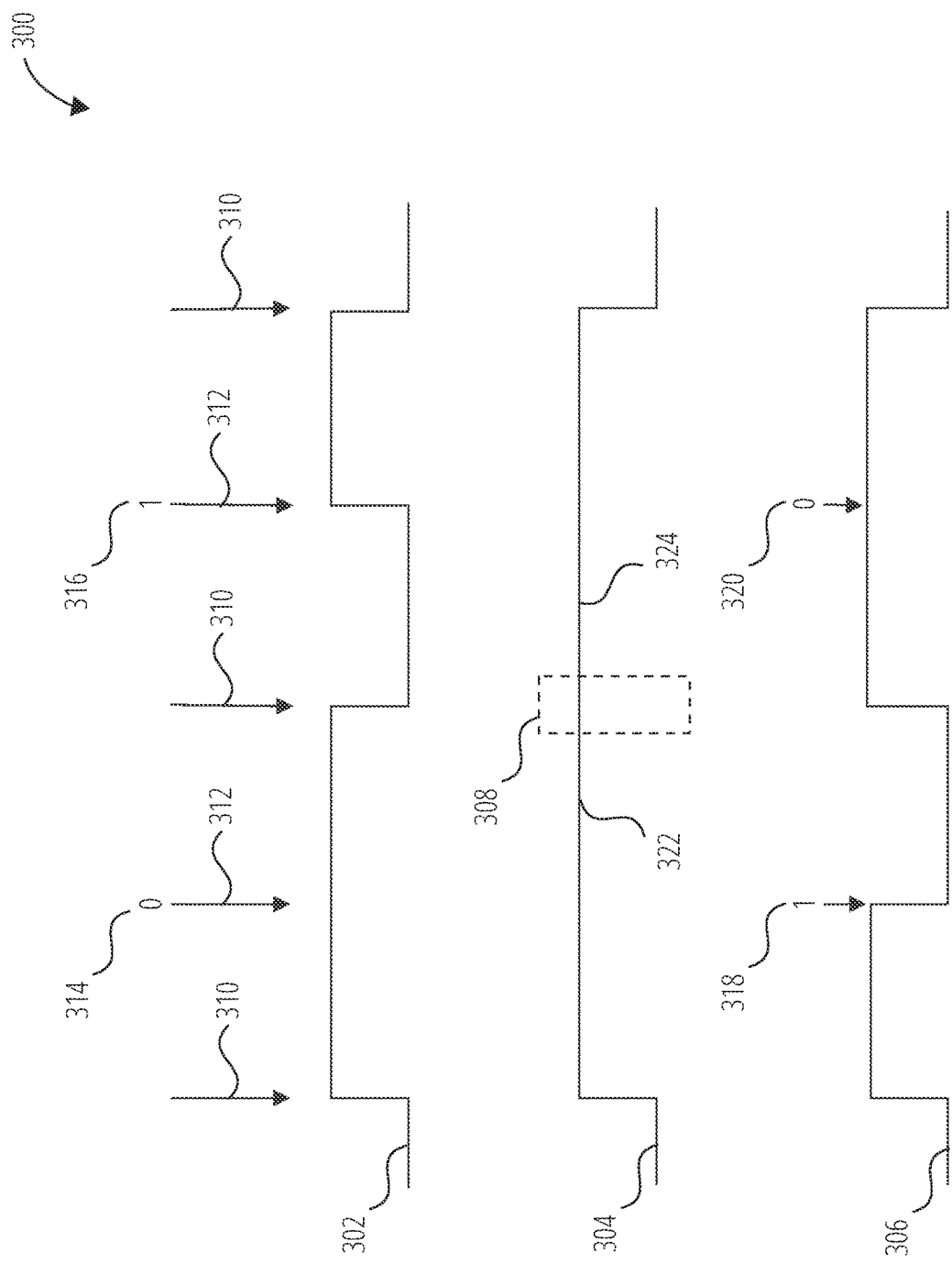
FIG. 3 is a signal timing diagram illustrating another DME violation.

FIG. 3 is a signal timing diagram 300 illustrating another DME violation 308. The signal timing diagram 300 includes an original waveform 302, a received waveform 304, and a corrected waveform 306, and illustrates clock transitions 310 and data transitions 312. The original waveform 302 includes a first encoded bit 314 (a "0" as no transition between logic voltage levels occurs at the respective data transition 312, i.e., between the clock transitions 310) and a second encoded bit 316 (e.g., a "1" as a transition between a logic level low and a logic level high occurs at the respective data transition 312, i.e., between the clock transitions 310).

The received waveform 304 may be a received version of the original waveform 302, which is received through a shared transmission medium 106 (FIG. 1) of a wired local area network (e.g., Ethernet). As seen in FIG. 3, the received waveform 304 includes a DME violation 308 because there is no transition of the received waveform 304 between logic voltage levels at the clock transition 310. When a DME violation such as the DME violation 308 of FIG. 3 occurs, the decoder will guess whether a prior half symbol 322 just prior to the DME violation 308 or a following half symbol 324 just following the DME violation 308 has been inverted. In the absence of any additional information, the probability of correctly guessing whether the prior half symbol 322 or the following half symbol 324 should be inverted is 50% (50% of guessing correctly and 50% of guessing incorrectly, causing bit errors).

The corrected waveform 306 reflects the waveform that would result if the decoder incorrectly guessed that the prior half symbol 322 of the received waveform 304 should be inverted. As a result, the corrected waveform 306 includes a first decoded bit 318 of "1" and a second decoded bit 320 of "0," which amounts to two bit errors compared to the original waveform 302 having the first encoded bit 314 of "0" and the second encoded bit 316 of "1." Accordingly, when the decoder incorrectly guesses that the wrong half symbol should be inverted, the incorrect guess results in two bit errors. With a large number of DME violations over time, two bit errors per DME violation at 50% odds of correcting the DME violation correctly averages out to about one bit error per DME violation. As a result, some embodiments herein are directed to estimating the BER to be the same as a detected DME violation rate.

Figure 4:
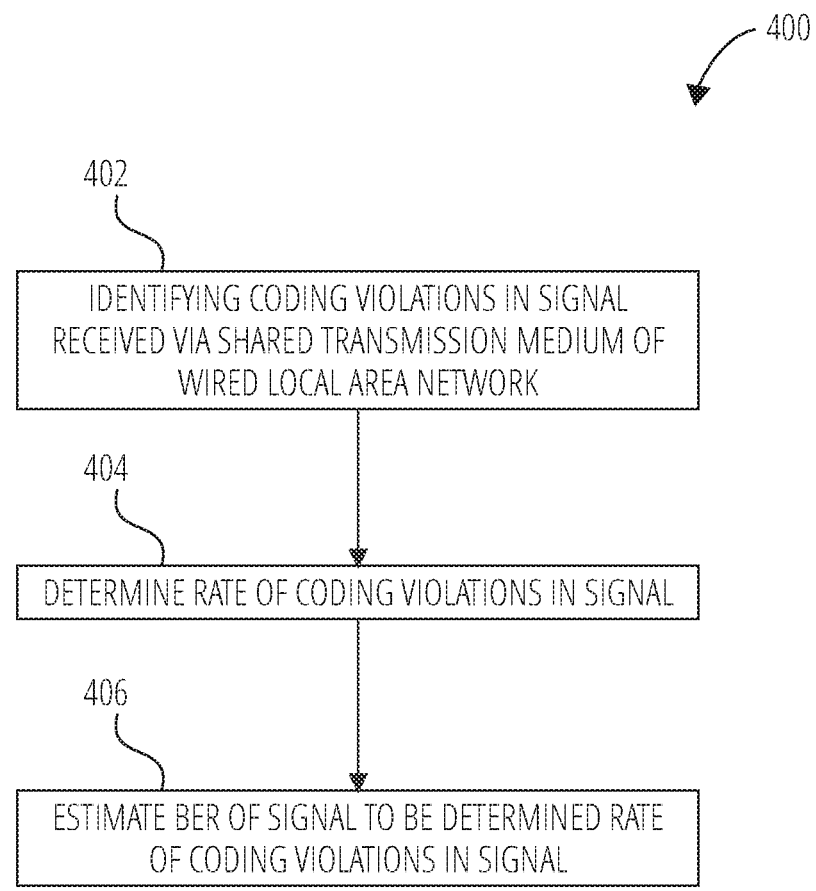
FIG. 4 is a flowchart illustrating a method of determining a BER of a signal, according to some embodiments.

FIG. 4 is a flowchart illustrating a method 400 of determining a BER of a signal, according to some embodiments. In operation 402, method 400 identifies coding violations in a signal received via a shared transmission medium of a wired local area network. In some embodiments, identifying coding violations in a signal includes identifying DME violations in the signal.

In operation 404, method 400 determines a rate of the DME coding violations in the signal per unit time. In operation 406, method 400 estimates a BER of the signal to be equal to the determined rate of the DME coding violations in the signal per unit time.

Figure 5:
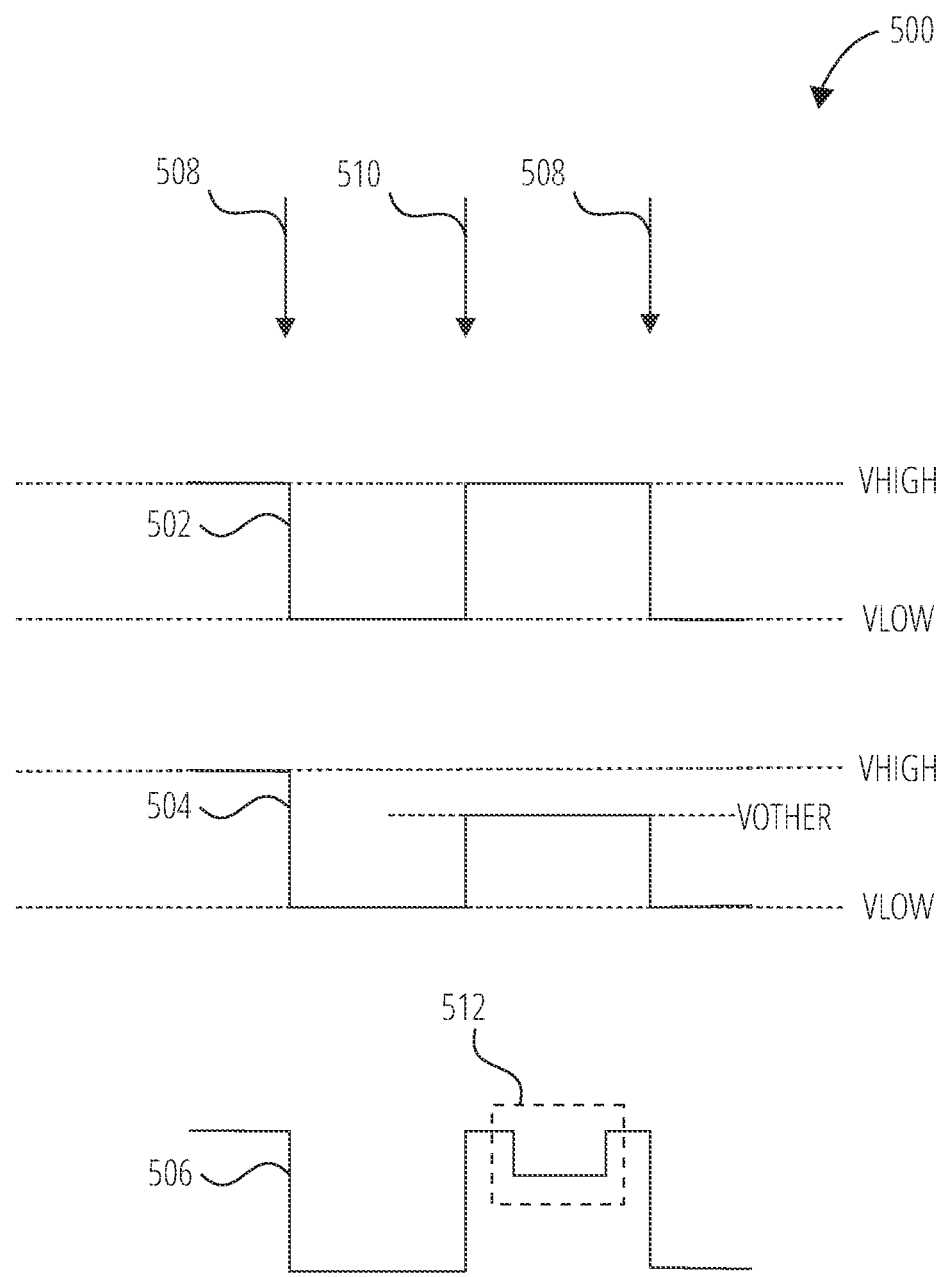
FIG. 5 is a signal timing diagram illustrating different signal integrity deficiencies, according to some embodiments.

FIG. 5 is a signal timing diagram 500 illustrating different signal integrity deficiencies, according to some embodiments. The signal timing diagram 500 includes a signal waveform 502, a received signal waveform 504, and another received signal waveform 506. The signal timing diagram 500 also indicates clock transitions 508, and a data transition 510. The received signal waveform 504 and the received signal waveform 506 may be received versions of the signal waveform 502, which may be received through a shared transmission medium 106 (FIG. 1) of a wired local area network (e.g., Ethernet).

As can be seen in FIG. 5, the signal waveform 502 alternates between two logic voltage levels: a logic high voltage level VHIGH and a logic low voltage level VLOW. The signal waveform 502 also has a clean square wave shape. As a result, signal waveform 502 has a high level of signal integrity at the symbols (e.g., the half symbols) thereof that are shown in FIG. 5.

The received signal waveform 504 includes a half symbol that fails to reach the logic high voltage level VHIGH. As a result, this half symbol of the received signal waveform 504 has decreased signal integrity because an amplitude of the half symbol is deficient as compared to that of the signal waveform 502.

The received signal waveform 506 includes a half symbol that fails to manifest a clean square wave waveform. For example, at segment 512 the received signal waveform 506 deviates from a clean waveform during a half symbol of the received signal waveform 506. As a result, the received signal waveform 506 has decreased signal integrity because of decreased signal quality as compared to the signal waveform 502.

Improved error correction may be applied if the signal integrity of each half symbol is known. Signal integrity may include signal amplitude, signal quality (e.g., waveform shape), other factors, or combinations thereof. A half symbol having poorer signal integrity (e.g., deviating further from an expected signal integrity) than another half symbol has a higher probability of having been inverted. As a result, where a DME violation is accompanied by adjacent half symbols that have disparate signal integrities, it is possible that a resulting decoded bit error may be corrected by correcting the half symbol that has poorer signal integrity. The final BER may be reduced by correcting the half symbol that has poorer signal integrity (e.g., a signal integrity that deviates more from an expected signal integrity). Of course, where signal integrities of half symbols adjacent to a DME violation are about the same, it may be difficult or impossible to determine which half symbol has been inverted based on the signal integrities alone.

Figure 6:
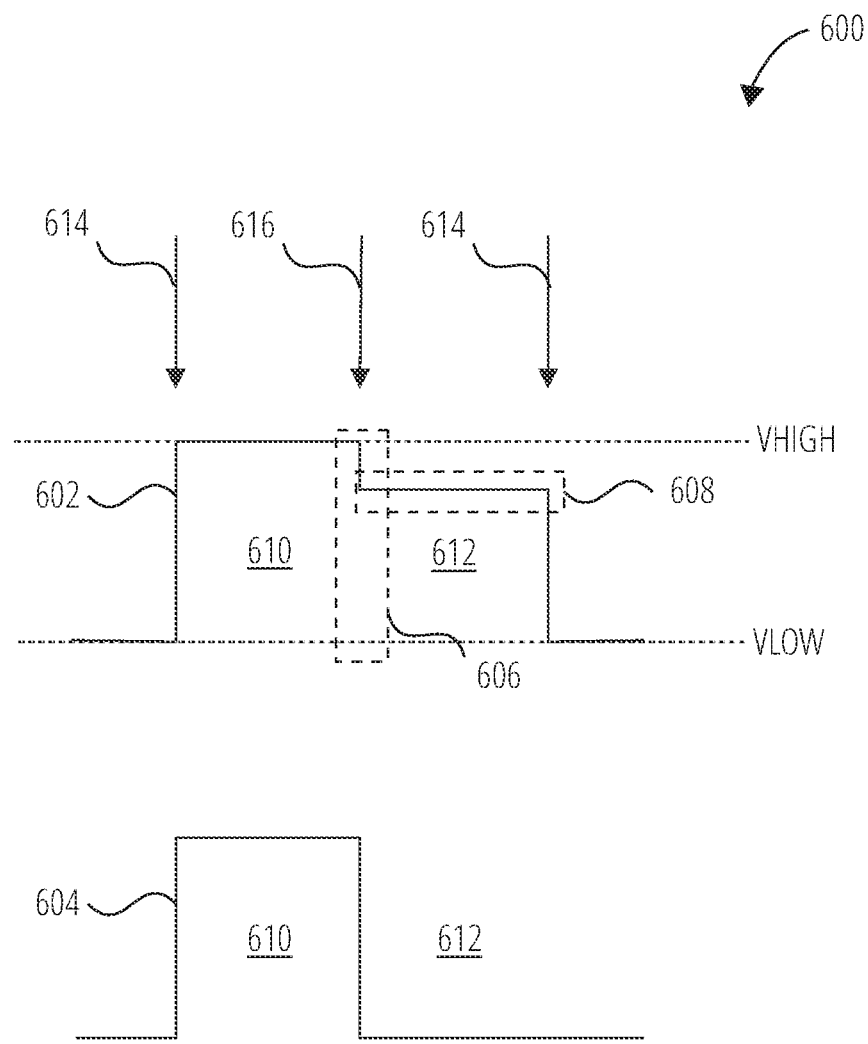
FIG. 6 is a signal timing diagram illustrating error correction based on signal amplitude, according to some embodiments.

FIG. 6 is a signal timing diagram 600 illustrating error correction based on signal amplitude, according to some embodiments. The signal timing diagram 600 includes a received signal 602 and a corrected signal 604, and illustrates data transitions 614 and a clock transition 616. At the clock transition 616, the received signal 602 includes a DME violation 606 because there is no transition in the received signal 602 at the clock transition 616.

The received signal 602 also includes a preceding half symbol 610 immediately preceding the DME violation 606 and a following half symbol 612 immediately following the DME violation 606. The received signal 602 alternates between a logic level high voltage level VHIGH and a logic level low voltage level VLOW, except for at a segment 608 during the following half symbol 612 is not quite at VHIGH. Rather than randomly choosing one of the preceding half symbol 610 or the following half symbol 612 to invert to attempt to correct the received signal 602, a decoder may consider amplitudes of the preceding half symbol 610 and the following half symbol 612. For example, the decoder may detect that the amplitude of the received signal 602 at the segment 608 is not at VHIGH or VLOW, and therefore determine that the following half symbol 612 should be inverted.

The corrected signal 604 illustrates the received signal 602 after correction. For example, since it was detected that the signal amplitude of the received signal 602 at segment 608 during the following half symbol 612 was not at an expected level, the decoder may determine that the following half symbol 612 should be inverted. In the corrected signal 604 the following half symbol 612 is shown inverted.

Figure 7:
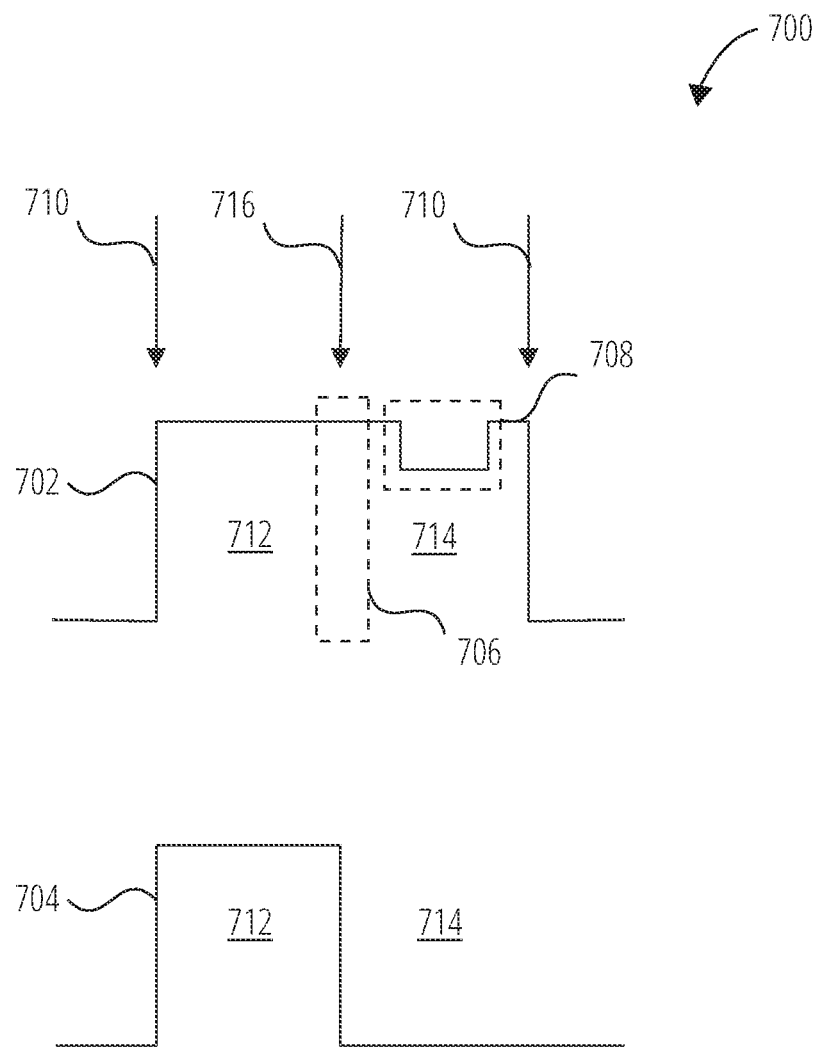
FIG. 7 is a signal timing diagram illustrating error correction based on signal quality, according to some embodiments.

FIG. 7 is a signal timing diagram 700 illustrating error correction based on signal quality, according to some embodiments. The signal timing diagram 700 includes a received signal 702 and a corrected signal 704, and illustrates data transitions 710 and a clock transition 716. At the clock transition 716, the received signal 702 includes a DME violation 706 because there is no transition in the received signal 702 at the clock transition 716.

The received signal 702 also includes a preceding half symbol 712 immediately preceding the DME violation 706 and a following half symbol 714 immediately following the DME violation 706. The received signal 702 maintains a square wave shape, except for at a segment 708 during the following half symbol 714 shows some artifacts rather than staying at a constant level. Rather than randomly choosing one of the preceding half symbol 712 or the following half symbol 714 to invert to attempt to correct the received signal 702, a decoder may consider the signal qualities of the preceding half symbol 712 and the following half symbol 714. For example, the decoder may detect that the waveform shape of the received signal 702 at the segment 708 is not in accordance with a square wave, i.e., has an improper shape integrity, and therefore determine that the following half symbol 714 should be inverted.

The corrected signal 704 illustrates the received signal 702 after correction. For example, since it was detected that the signal quality of the received signal 702 at segment 708 during the following half symbol 714 deviated from the expected square wave, the decoder may determine that the following half symbol 714 should be inverted. In the corrected signal 704 the following half symbol 714 is shown inverted.

Figure 8:
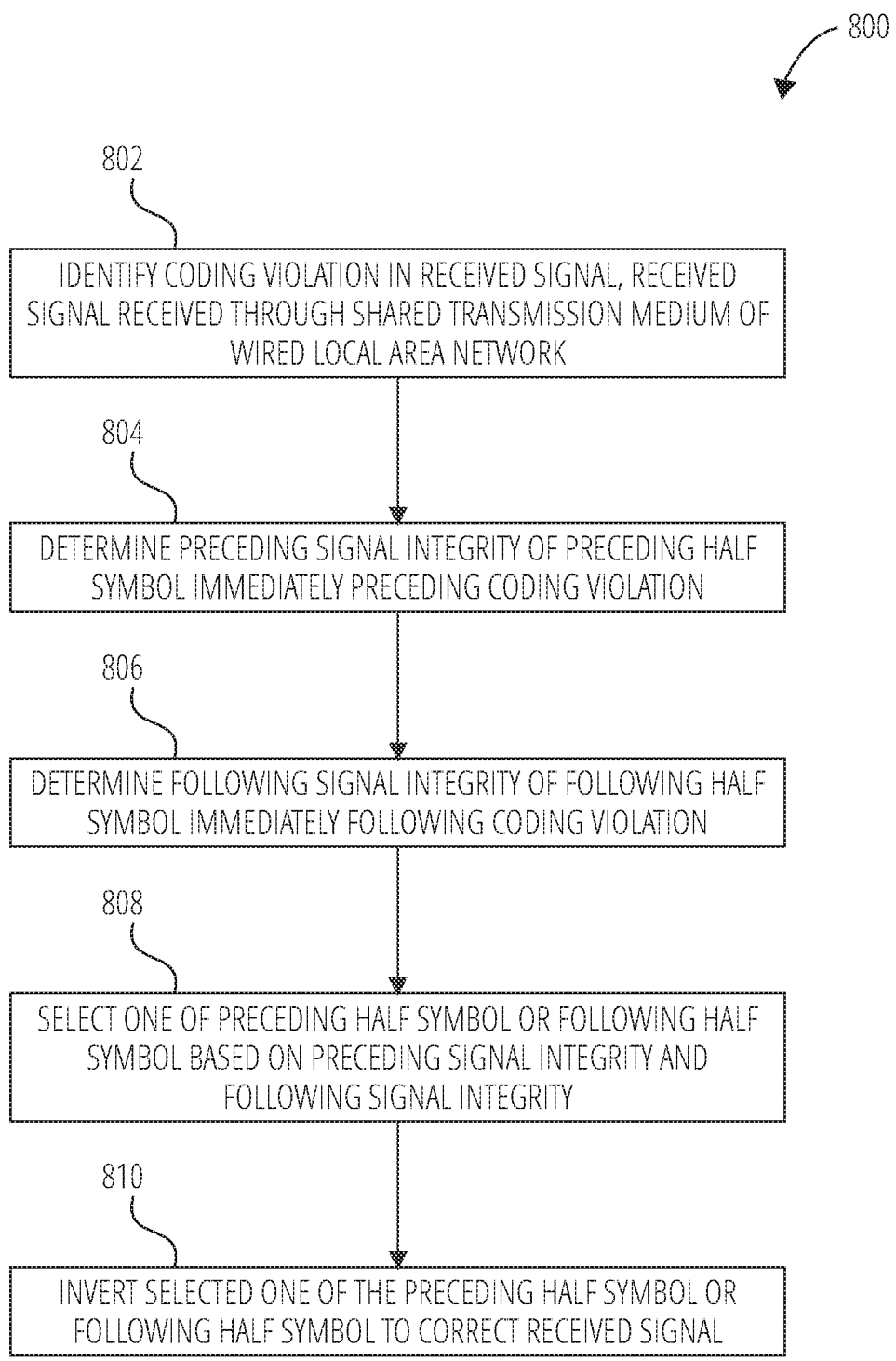
FIG. 8 is a flowchart illustrating a method of correcting an error in a signal, according to some embodiments.

FIG. 8 is a flowchart illustrating a method 800 of correcting an error in a signal, according to some embodiments. In operation 802, method 800 identifies a coding violation in a received signal, the received signal received through a shared transmission medium of a wired local area network. In some embodiments, identifying a coding violation includes identifying a DME violation.

In operation 804, method 800 determines a preceding signal integrity of a preceding half symbol immediately preceding the coding violation. In operation 806, method 800 determines a following signal integrity of a following half symbol immediately following the coding violation. In some embodiments, determining a preceding signal integrity and determining a following signal integrity includes determining signal amplitude integrities of the preceding half symbol and the following half symbol. In some embodiments, determining a preceding signal integrity and determining a following signal integrity includes determining signal waveform shape integrities of the preceding half symbol and the following half symbol.

In operation 808, method 800 selects one of the preceding half symbol or the following half symbol based on the preceding signal integrity and the following signal integrity. In some embodiments, selecting one of the preceding half symbol or the following half symbol includes selecting the one of the preceding half symbol or the following half symbol that has an amplitude that is furthest from an expected amplitude. In some embodiments, selecting one of the preceding half symbol or the following half symbol includes selecting the one of the preceding half symbol or the following half symbol that has a signal waveform shape that is furthest from an expected signal waveform shape. In operation 810, method 800 inverts the selected one of the preceding half symbol or the following half symbol to correct the received signal.

When an actual BER of a signal is low and/or if consecutive packets are received from different sources, direct measurement of the BER may not be practical. In such cases the BER may be obtained using a lookup table that maintains BER as a function of signal noise.

Figure 9:
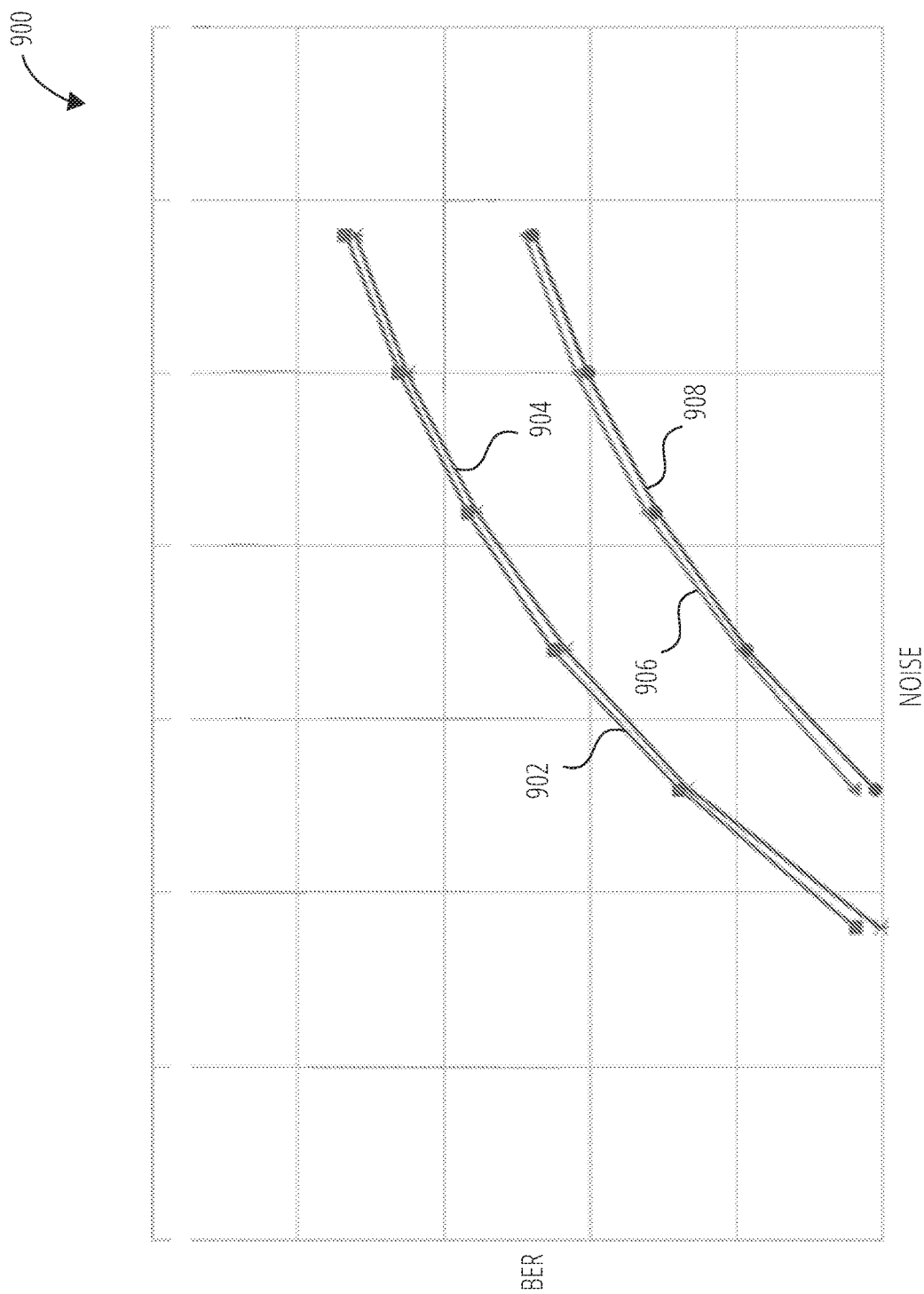
FIG. 9 is a BER plot illustrating examples of estimated BERs and measured BERs plotted against dither gain, according to some embodiments.

FIG. 9 is a BER plot 900 illustrating examples of estimated BERs and measured BERs plotted against Gaussian noise standard deviation, according to some embodiments. As such, the plot may illustrate how increasing levels of noise influence the BER. The BER plot 900 includes an actual BER 902 and an estimated BER 904 taken without using the error correction embodiments disclosed herein. Actual BER 902 is counted based on a real bit error. An estimated BER 904 is counted in a PHY (e.g., the PHY 102 of FIG. 1) based on DME violations, as discussed above. As may be seen by observation of actual BER 902 and estimated BER 904 in the BER plot 900, estimated BER 904 is quite close to actual BER 902.

The BER plot 900 also includes an actual BER 906 and an estimated BER 908 taken using the error correction embodiments disclosed herein. As can be seen by observing actual BER 906 and estimated BER 908 as compared to actual BER 902 and estimated BER 904, respectively, the error correction embodiments disclosed herein improve performance (i.e., decrease the BER).

According to embodiments disclosed herein, a BER status may be reported. For example, a 10SPE PHY (e.g., the PHY 102 of FIG. 1) may be configured to determine and report a BER status. Where the PHY detects no DME violations, a BER of zero may be determined. Where DME violations are detected, bit errors are occurring and will result in a BER that may be estimated, though the bit errors may be corrected. In some instances a bit error may be detected based on a detected DME, but may not be corrected (e.g., the signal integrities of the preceding half symbol and the following half symbol are about the same). A number of the uncorrected DME violations may be counted to determine a BER of the corrected signal.

Although FIG. 9 illustrates that estimated BER 904 is similar to actual BER 902 and estimated BER 908 is similar to actual BER 906, there are differences between estimated BER 904 and actual BER 902, and between estimated BER 908 and actual BER 906 (i.e., different BER levels).

Figure 10:
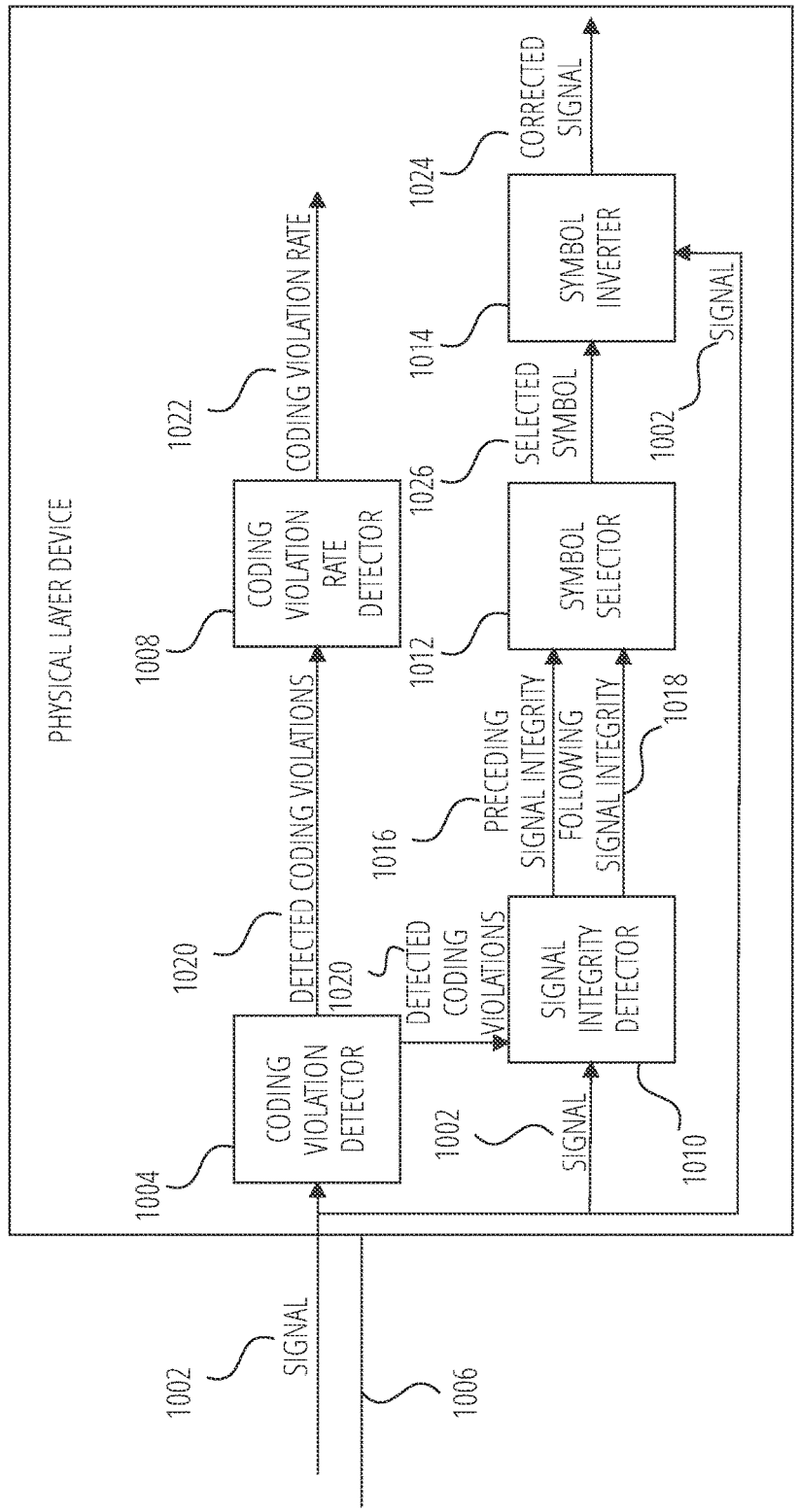
FIG. 10 is a block diagram of a physical layer device, according to some embodiments.

FIG. 10 is a block diagram of a physical layer device 1000, according to some embodiments. In some embodiments the PHY 102 may include the physical layer device 1000. The physical layer device 1000 includes an input 1006 (e.g., a pin of a semiconductor device package including the physical layer device 1000) configured to receive a signal 1002 from a shared transmission medium (e.g., the shared transmission medium 106 of FIG. 1). The physical layer device 1000 is configured to estimate a BER of the signal 1002 and correct bit errors in the signal 1002 responsive to half symbol signal integrity.

The physical layer device 1000 includes a coding violation detector 1004 configured to receive the signal 1002, detect coding violations (e.g., DME coding violations) in signal 1002, and indicate detected coding violations 1020 to a coding violation rate detector 1008. The coding violation rate detector 1008 is configured to receive the detected coding violations 1020 and determine a coding violation rate 1022 based, at least in part, on the detected coding violations 1020.

The coding violation detector 1004 is also configured to provide the detected coding violations 1020 to a signal integrity detector 1010. The signal integrity detector 1010 is configured to receive the detected coding violations 1020 and identify a preceding signal integrity 1016 of a preceding half symbol of the signal 1002 immediately preceding a detected coding violation and a following signal integrity 1018 of a following half symbol immediately following the detected coding violation. The signal integrity detector 1010 is configured to provide the preceding signal integrity 1016 and the following signal integrity 1018 to a symbol selector 1012.

The symbol selector 1012 is configured to receive the preceding signal integrity 1016 and the following signal integrity 1018 and select one of the preceding half symbol or the following half symbol based, at least in part, on the preceding signal integrity 1016 and the following signal integrity 1018. The symbol selector 1012 is configured to provide a selected symbol 1026 indicating which of the preceding half symbol or the following half symbol has been selected to a symbol inverter 1014.

The symbol inverter 1014 is configured to receive the selected symbol 1026 and invert the selected one of the preceding half symbol or the following half symbol, as indicated by the selected symbol 1026. With the half symbol inverted, the symbol inverter 1014 is configured to provide a corrected signal 1024 including the inverted half symbol.

In some embodiments the physical layer device 1000 includes one or more processors configured to perform the operations of the physical layer device 1000. In some embodiments, some or all of the physical layer device 1000 may be implemented using software or firmware stored by one or more data storage devices and executed by processing circuitry (see the computing device 1100 of FIG. 11). In some embodiments, some or all of the physical layer device 1000 may be implemented using electrical hardware components such as combinational logic. By way of non-limiting example, some or all of the physical layer device 1000 may be implemented using a Field Programmable Gate Array (FPGA), a Programmable Logic Controller (PLC), other logic device, or combinations thereof.

Figure 11:
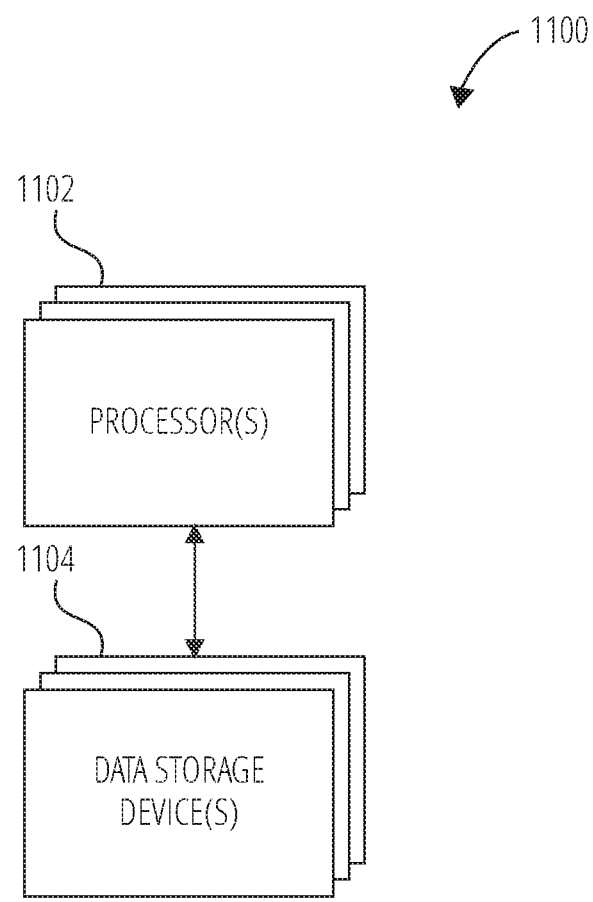
FIG. 11 is a block diagram of a computing device that may be used in some embodiments.

FIG. 11 is a block diagram of a computing device 1100 that may be used in some embodiments. The computing device 1100 includes one or more processors 1102 (sometimes referred to herein as "processors" 1102) operably coupled to one or more data storage devices 1104 (sometimes referred to herein as "storage" 1104). The storage 1104 includes computer-readable instructions stored thereon. The computer-readable instructions are configured to instruct the processors 1102 to perform operations of embodiments disclosed herein. For example, the computer-readable instructions may be configured to instruct the processors 1102 to perform at least a portion or a totality of the method 400 of FIG. 4 and/or the method 800 of FIG. 8. As another example, the computer-readable instructions may be configured to instruct the processors 1102 to perform at least a portion or a totality of the operations discussed for the PHY 102 of FIG. 1. As a further example, the computer-readable instructions may be configured to instruct the processors 1102 to perform at least a portion or a totality of the operations discussed for the physical layer device 1000 of FIG. 10. As a specific, non-limiting example, the computer-readable instructions may be configured to instruct the processors 1102 to estimate a BER of a signal received from a shared transmission medium 106 of a wired local area network based on a rate of detected DME violations in the signal. As another specific, non-limiting example, the computer-readable instructions may be configured to instruct the processors 1102 to correct bit errors in a received signal by inverting one of a preceding half symbol preceding a detected DME violation or a following half symbol following the detected DME violation based on signal integrities of the preceding half symbol and the following half symbol.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different sub-combinations of some of the elements. For example, the phrase "A, B, C, D, or combinations thereof" may refer to any one of A, B, C, or D; the combination of each of A, B, C, and D; and any sub-combination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

EXAMPLES

A non-exhaustive, non-limiting list of example embodiments follows. Not each of the example embodiments listed below are individually indicated as being combinable with all others of the example embodiments listed below and embodiments discussed above. It is intended, however, that these example embodiments are combinable with all other example embodiments and embodiments discussed above unless it would be apparent to one of ordinary skill in the art that the embodiments are not combinable.

Example 1

A physical layer device, comprising: an input configured to receive a signal from a shared transmission medium of a wired local area network; and one or more processors configured to: identify coding violations in a signal received via a shared transmission medium of a wired local area network; determine a rate of the coding violations in the signal; and estimate a bit error rate of the signal to be the determined rate of the coding violations.

Example 2

The physical layer device of Example 1, wherein the coding violations comprise differential Manchester encoding violations.

Example 3

The physical layer device according to any one of Examples 1 and 2, wherein the one or more processors are further configured to correct one or more symbols adjacent to the identified coding violations in the signal.

Example 3A

The physical layer device of Example 3, wherein the one or more processors are configured to correct the one or more symbols adjacent to the identified coding violations by inverting half symbols of the one or more symbols adjacent to the identified coding violations.

Example 4

The physical layer device of Example 3, wherein the one or more processors are further configured to correct the one or more symbols based on signal integrities of a preceding symbol preceding the coding violation and a following symbol following the coding violation.

Example 5

A physical layer device, comprising: an input configured to receive a signal from a shared transmission medium of a wired local area network; and one or more processors configured to: identify a coding violation in the received signal; determine a preceding signal integrity of a preceding half symbol immediately preceding the coding violation; determine a following signal integrity of a following half symbol immediately following the coding violation; select one of the preceding half symbol or the following half symbol based, at least in part, on the preceding signal integrity and the following signal integrity; and invert the selected one of the preceding half symbol or the following half symbol to correct the received signal.

Example 6

The physical layer device of Example 5, wherein the coding violation comprises a differential Manchester encoding violation.

Example 7

The physical layer device according to any one of Examples 5 and 6, wherein the signal integrity is a signal amplitude of the preceding half symbol and the following half symbol.

Example 8

The physical layer device of Example 7, wherein the signal integrity is a difference between a measured amplitude and an expected amplitude.

Example 9

The physical layer device according to any one of Examples 5 and 6, wherein the signal integrity is a signal waveform shape integrity of the preceding half symbol and the following half symbol.

Example 10

The physical layer device of Example 9, wherein the signal waveform shape integrity includes a difference between a determined signal waveform shape of the signal and an expected signal waveform shape.

Example 11

A method of estimating a bit error rate (BER) of a signal, the method comprising: identifying coding violations in a signal received via a shared transmission medium of a wired local area network; determining a rate of the coding violations in the signal; and estimating a BER of the signal to be the determined rate of the coding violations in the signal.

Example 12

The method of Example 11, further comprising identifying signal integrities of a half symbol before and of a half symbol after a coding violation.

Example 13

The method of Example 12, wherein identifying signal integrities of a half symbol before and of a half symbol after a coding violation includes identifying signal amplitude integrities of the half symbol before and of the half symbol after the coding violation.

Example 14

The method of Example 12, wherein identifying signal integrities of a half symbol before and of a half symbol after a coding violation includes identifying signal waveform shape integrities of the half symbol before and of the half symbol after the coding violation.

Example 15

The method according to any one of Examples 12-14, further comprising: determining that one of the half symbol before or the half symbol after the coding violation has a signal integrity that differs from an expected signal integrity more than the other of the half symbol before or the half symbol after; and correcting the one of the half symbol before or the half symbol after that has the signal integrity that differs more than the other.

Example 16

The method of Example 15, wherein correcting the one of the half symbol before or the half symbol after comprises inverting the one of the half symbol before or the half symbol after.

Example 17

A method of performing error correction on a received signal, the method comprising: identifying a coding violation in a received signal, the received signal received through a shared transmission medium of a wired local area network; determining a preceding signal integrity of a preceding symbol immediately preceding the coding violation; determining a following signal integrity of a following symbol immediately following the coding violation; selecting one of the preceding symbol or the following symbol based, at least in part, on the preceding signal integrity and the following signal integrity; and inverting the selected one of the preceding symbol or the following symbol to correct the received signal.

Example 18

The method of Example 17, wherein determining the preceding signal integrity and determining the following signal integrity comprises determining signal amplitude integrities of the preceding symbol and the following symbol.

Example 19

The method according to any one of Examples 17 and 18, wherein selecting one of the preceding symbol or the following symbol based, at least in part, on the preceding signal integrity and the following signal integrity comprises selecting the one of the preceding symbol or the following symbol that has an amplitude that is furthest from an expected amplitude.

Example 20

The method according to any one of Examples 17 and 19, wherein determining the preceding signal integrity and determining the following signal integrity comprises determining signal waveform shape integrities of the preceding symbol and the following symbol.

CONCLUSION

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. A physical layer device, comprising:
   an input to receive a signal from a shared transmission medium of a wired local area network, the shared transmission medium of the wired local area network comprising a physical medium that is a communication path between nodes that are part of the wired local area network, the nodes including respective instances of physical layer devices; and
   one or more processors to, at the physical layer device and in a physical layer of an Open Systems Interconnection (OSI) model:
      identify coding violations in the signal received via the shared transmission medium of the wired local area network, the coding violations including two-level differential Manchester Encoding (DME) violations wherein signal transitions are not detected at respective clock transitions;
      determine a rate of the coding violations in the signal; and
      estimate a bit error rate of the signal to be the determined rate of the coding violations.

2. The physical layer device of claim 1, the one or more processors to correct one or more half symbols adjacent to the identified coding violations in the signal.

3. The physical layer device of claim 2, the one or more processors to correct the one or more half symbols based on signal integrities of a preceding symbol preceding the coding violation and a following symbol following the coding violation.

4. A physical layer device, comprising:
   an input to receive a signal from a shared transmission medium of a wired local area network, the shared transmission medium of the wired local area network comprising a physical medium that is a communication path between nodes that are part of the wired local area network, the nodes including respective instances of physical layer devices; and
   one or more processors to, in a physical layer of an Open Systems Interconnection (OSI) model:
      identify a coding violation in the received signal, the coding violation including a two-level differential Manchester Encoding (DME) violation wherein a signal transition is not detected at a clock transition;
      determine a preceding signal integrity of a preceding half symbol immediately preceding the coding violation;
      determine a following signal integrity of a following half symbol immediately following the coding violation;
      select one of the preceding half symbol or the following half symbol based, at least in part, on the preceding signal integrity and the following signal integrity; and
      invert the selected one of the preceding half symbol or the following half symbol to correct the received signal.

5. The physical layer device of claim 4, wherein the signal integrity is a signal amplitude of the preceding half symbol and the following half symbol.

6. The physical layer device of claim 5, wherein the signal integrity is a difference between a measured amplitude and an expected amplitude.

7. The physical layer device of claim 4, wherein the signal integrity is a signal waveform shape integrity of the preceding half symbol and the following half symbol.

8. The physical layer device of claim 7, wherein the signal waveform shape integrity includes a difference between a determined signal waveform shape of the signal and an expected signal waveform shape.

9. A method of estimating a bit error rate (BER) of a signal, the method comprising, in a physical layer of an Open Systems Interconnection (OSI) model:
   identifying coding violations in a signal received via a shared transmission medium of a wired local area network, the shared transmission medium of the wired local area network comprising a physical medium that is a communication path between nodes that are part of the wired local area network, the nodes including respective instances of physical layer devices, the coding violations including two-level differential Manchester Encoding (DME) violations wherein signal transitions are not detected at respective clock transitions;
   determining a rate of the coding violations in the signal; and
   estimating a BER of the signal to be the determined rate of the coding violations in the signal.

10. The method of claim 9, comprising identifying signal integrities of a half symbol before and of a half symbol after a coding violation.

11. The method of claim 10, wherein identifying signal integrities of a half symbol before and of a half symbol after a coding violation includes identifying signal amplitude integrities of the half symbol before and of the half symbol after the coding violation.

12. The method of claim 10, wherein identifying signal integrities of a half symbol before and of a half symbol after a coding violation includes identifying signal waveform shape integrities of the half symbol before and of the half symbol after the coding violation.

13. The method of claim 10, comprising:
   determining that one of the half symbol before or the half symbol after the coding violation has a signal integrity that differs from an expected signal integrity more than the other of the half symbol before or the half symbol after; and
   correcting the one of the half symbol before or the half symbol after that has the signal integrity that differs more than the other.

14. The method of claim 13, wherein correcting the one of the half symbol before or the half symbol after comprises inverting the one of the half symbol before or the half symbol after.

15. A method of performing error correction on a received signal, the method comprising, in a physical layer of an Open Systems Interconnection (OSI) model:

identifying a coding violation in a received signal, the received signal received through a shared transmission medium of a wired local area network, the shared transmission medium of the wired local area network comprising a physical medium that is a communication path between nodes that are part of the wired local area network, the nodes including respective instances of physical layer devices, the coding violation including a two-level differential Manchester Encoding (DME) violation wherein a signal transition is not detected at a clock transition;

determining a preceding signal integrity of a preceding symbol immediately preceding the coding violation;

determining a following signal integrity of a following symbol immediately following the coding violation;

selecting one of the preceding symbol or the following symbol based, at least in part, on the preceding signal integrity and the following signal integrity; and inverting the selected one of the preceding symbol or the following symbol to correct the received signal.

16. The method of claim 15, wherein determining the preceding signal integrity and determining the following signal integrity comprises determining signal amplitude integrities of the preceding symbol and the following symbol.

17. The method of claim 15, wherein selecting one of the preceding symbol or the following symbol based, at least in part, on the preceding signal integrity and the following signal integrity comprises selecting the one of the preceding symbol or the following symbol that has an amplitude that is furthest from an expected amplitude.

18. The method of claim 15, wherein determining the preceding signal integrity and determining the following signal integrity comprises determining signal waveform shape integrities of the preceding symbol and the following symbol.

* * * * *